US009148957B2

(12) United States Patent
Matsui et al.

(10) Patent No.: US 9,148,957 B2
(45) Date of Patent: Sep. 29, 2015

(54) ELECTRONIC CIRCUIT SUBSTRATE, DISPLAY DEVICE, AND WIRING SUBSTRATE

(75) Inventors: Takashi Matsui, Osaka (JP); Motoji Shiota, Osaka (JP); Hiroki Nakahama, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 265 days.

(21) Appl. No.: 14/002,346

(22) PCT Filed: Mar. 1, 2012

(86) PCT No.: PCT/JP2012/055266
§ 371 (c)(1),
(2), (4) Date: Aug. 29, 2013

(87) PCT Pub. No.: WO2012/121113
PCT Pub. Date: Sep. 13, 2012

(65) Prior Publication Data
US 2013/0335940 A1 Dec. 19, 2013

(30) Foreign Application Priority Data
Mar. 4, 2011 (JP) ................................. 2011-047452

(51) Int. Cl.
*H05K 7/00* (2006.01)
*H05K 1/18* (2006.01)
(Continued)

(52) U.S. Cl.
CPC .............. *H05K 1/18* (2013.01); *G02F 1/13454* (2013.01); *H01L 23/49811* (2013.01); *H01L 24/16* (2013.01); *H01L 24/81* (2013.01); *H01L 24/83* (2013.01); *H01L 24/92* (2013.01); *H05K 1/111* (2013.01); *H01L 23/49838* (2013.01); *H01L 24/13* (2013.01); *H01L 2224/10165* (2013.01); *H01L 2224/13013* (2013.01); *H01L 2224/13144* (2013.01); *H01L 2224/14132* (2013.01);
(Continued)

(58) Field of Classification Search
CPC ................... H01L 23/49811; H01L 23/49838; H01L 24/13; H01L 24/16; H01L 24/81; H01L 24/83; H01L 24/92; G02F 1/13454; H05K 1/111; H05K 1/18; H05K 2201/09436; H05K 2201/09709; H05K 2201/09745
USPC ........... 361/760, 767, 770, 772; 174/250–262
See application file for complete search history.

(56) References Cited

U.S. PATENT DOCUMENTS

| 5,315,239 A * | 5/1994 | Vitriol | 324/750.3 |
| 7,751,016 B2 * | 7/2010 | Abe et al. | 349/150 |

(Continued)

FOREIGN PATENT DOCUMENTS

| JP | H11-345302 A | 12/1999 |
| JP | 2000-183490 A | 6/2000 |

(Continued)

*Primary Examiner* — Yuriy Semenenko
(74) *Attorney, Agent, or Firm* — Chen Yoshimura LLP (57) ABSTRACT

A wiring substrate (11) includes: a substrate; and, formed upon the substrate, a plurality of wiring lines, a plurality of circuit elements, and a plurality of connecting terminals (51) connected via the plurality of wiring lines. Each of the plurality of connecting terminals (51) includes a pair of protrusion parts (50), forming a depression part (60) between the pair of protrusion parts (50), and a depression electrode (52) that is disposed in the depression part (60) and that at least partially covers each protrusion of the pair of protrusion parts (50).

13 Claims, 7 Drawing Sheets

(51) Int. Cl.
*H01L 23/00* (2006.01)
*H05K 1/11* (2006.01)
*G02F 1/1345* (2006.01)
*H01L 23/498* (2006.01)

(52) U.S. Cl.
CPC ............. *H01L2224/14133* (2013.01); *H01L 2224/16237* (2013.01); *H01L 2224/293* (2013.01); *H01L 2224/2929* (2013.01); *H01L 2224/32225* (2013.01); *H01L 2224/73204* (2013.01); *H01L 2224/8114* (2013.01); *H01L 2224/81191* (2013.01); *H01L 2224/81385* (2013.01); *H01L 2224/81903* (2013.01); *H01L 2224/83851* (2013.01); *H01L 2224/9211* (2013.01); *H01L 2924/07802* (2013.01); *H01L 2924/15788* (2013.01); *H01L 2924/351* (2013.01); *H05K 2201/09436* (2013.01); *H05K 2201/09709* (2013.01); *H05K 2201/09745* (2013.01); *H05K 2201/09909* (2013.01); *H05K 2201/10674* (2013.01)

(56) References Cited

U.S. PATENT DOCUMENTS

| | | | |
|---|---|---|---|
| 2002/0149921 A1* | 10/2002 | Terasaka | 361/803 |
| 2005/0205296 A1 | 9/2005 | Ito | |
| 2005/0224561 A1* | 10/2005 | Kurasawa et al. | 228/180.22 |
| 2008/0239680 A1* | 10/2008 | Yasuda | 361/748 |
| 2009/0250250 A1* | 10/2009 | Ishii | 174/254 |
| 2012/0236230 A1 | 9/2012 | Nakahama et al. | |
| 2015/0077918 A1* | 3/2015 | Zhang et al. | 361/679.31 |
| 2015/0146395 A1* | 5/2015 | Ju et al. | 361/760 |

FOREIGN PATENT DOCUMENTS

| | | |
|---|---|---|
| JP | 2003-282769 A | 10/2003 |
| JP | 2005-266091 A | 9/2005 |
| JP | 2007-42777 A | 2/2007 |
| WO | 2011/061989 A1 | 5/2011 |

* cited by examiner

ELECTRONIC CIRCUIT SUBSTRATE, DISPLAY DEVICE, AND WIRING SUBSTRATE

TECHNICAL FIELD

The present invention relates to an electronic circuit substrate, a display device, and a wiring substrate, and more particularly, to a structure in which a semiconductor chip is mounted on the wiring substrate with face-down mounting.

BACKGROUND ART

In recent years, flat display devices such as liquid crystal display devices or organic EL display devices are widely used as display devices for televisions, mobile phones, smart-phones, and the like, for example. Such flat display devices are provided with a driver circuit (typically, a driver IC chip) for supplying driving signals to a display panel. In many cases, the display panel has at least one transparent substrate, and an IC chip having a driver circuit formed thereon is mounted on the transparent substrate.

A TFT liquid crystal display device, for example, has a glass substrate, and the glass substrate has formed thereon: pixel electrodes provided for respective pixels; TFTs provided such that each pixel electrode has at least one TFT; signal lines (source bus lines) connected to the pixel electrodes via the TFTs; and scan lines (gate bus lines) connected to the TFTs for controlling the switching of the TFTs. The driver IC chip for supplying prescribed signals (data signals and scan signals) to the signal lines and the scan lines is mounted on the same glass substrate (TFT substrate).

In terms of the mounting structure for the driver IC chip, a COG (chip on glass) method has been used in recent years because of the advantages thereof such as low cost, high reliability, and thickness reduction. In the COG method, the driver IC chip as a bare chip is mounted on the glass substrate of the liquid crystal panel. Other known methods include a COF method in which the driver IC chip is mounted on a film.

One known example of the COG method is a so-called face-down mounting structure in which protruding bump electrodes are formed on the surface of the driver IC chip where circuits are formed, and the bump electrodes are connected to respective pads (connecting terminal electrodes of scan lines or signal lines; also referred to as bonding pads) formed on a glass substrate of a liquid crystal panel. In this mounting structure, the bump electrodes are formed of a metal such as Au, for example, and are connected to the pads through an anisotropic conductive layer, for example.

Because the anisotropic conductive layer has conductivity only in the thickness direction, and not in the horizontal direction, it is not necessary to pattern the conductive layer, and the bump electrode and the pad facing each other can be electrically connected to each other through the anisotropic conductive layer. Also, because a gap between respective adjacent electrodes is filled with a resin material (adhesive material), it is possible to achieve excellent insulating properties. The anisotropic conductive layer is formed of an anisotropic conductive film (ACF), an anisotropic conductive paste (ACP), or the like.

Figure 10:
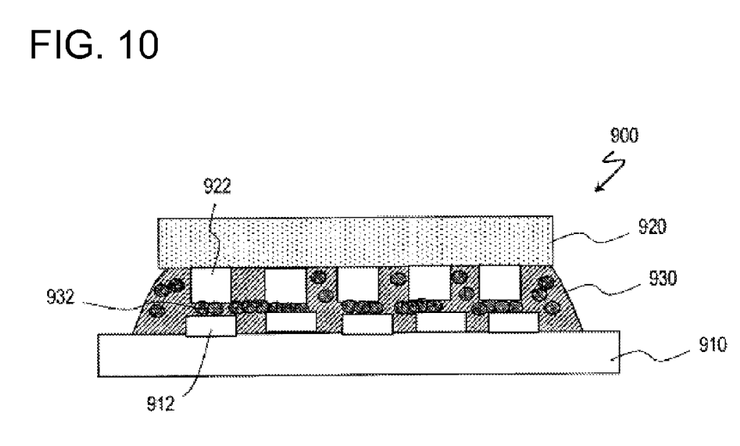
FIG. 10 is a cross-sectional view of a face-down chip mounting structure of a conventional COG method.

FIG. 10 shows a conventional chip mounting structure 900 in which a driver IC chip 920 is mounted in an edge of the liquid crystal panel with the face-down mounting. As shown in the figure, the driver IC chip 920 is connected to a TFT substrate 910 of the liquid crystal panel through an ACF 930. More specifically, bump electrodes 922 provided on the IC chip 920 and connecting terminals (pads) 912 provided on the TFT substrate 910 are electrically connected to each other via conductive particles 932 included in the ACF 930 provided between the IC chip 920 and the TFT substrate 910. By the resin material of the ACF 930 being cured, the IC chip 920 is affixed onto the TFT substrate 910.

Various techniques have been proposed for connecting an electronic component such as an IC chip to a wiring substrate such as a TFT substrate, and for example, a technique for improving the connection reliability by using an elastic body (resin material, for example) is known.

Patent Document 1 shows a structure in which a mounting substrate for an electronic component has a recess, and an electronic component is placed inside of the recess such that a conductive elastic body is interposed between the electronic component and the side faces of the recess. In this electronic component mounting structure, the electronic component is pressed toward the side faces of the recess by the elastic body, and connecting electrodes at the side faces of the recess and electrodes at the side faces of the electronic component are more reliably connected to each other.

Patent Document 2 discloses a configuration in which each pad is disposed on the chip mounting substrate through a protruding elastic body. In this manner, it is possible to achieve a high bonding property when the chip is mounted, regardless of the rigidity of the substrate. Patent Document 3 discloses a configuration in which a resin layer is provided on a mounting substrate, and an IC chip is connected to the substrate in such a manner that bump electrodes are connected to electrodes formed on the resin layer, while sinking into the resin layer.

RELATED ART DOCUMENTS

Patent Documents

Patent Document 1: Japanese Patent Application Laid-Open Publication No. 2000-183490
Patent Document 2: Japanese Patent Application Laid-Open Publication No. 2003-282769
Patent Document 3: Japanese Patent Application Laid-Open Publication No. H11-345302
Patent Document 4: Japanese Patent Application Laid-Open Publication No. 2007-42777
Patent Document 5: Japanese Patent Application Laid-Open Publication No. 2005-266091

SUMMARY OF THE INVENTION

Problems to be Solved by the Invention

In display devices such as liquid crystal display devices, due to an increase in number of pixels to achieve higher resolution, the number of connecting terminals in a display panel and the number of bump electrodes in a driver IC chip are increasing. On the other hand, there is a demand for minimizing the size of the IC chip from the perspectives of the manufacturing cost and the product size. In a display device having a frame region becoming narrower, in particular, it is difficult to install a large IC chip in the frame region in a periphery of the display panel.

This results in a need for mounting a small IC chip having a large number of bump electrodes on a wiring substrate. When such an IC chip is used, a pitch at which the bump electrodes of the IC chip are arranged (or a pitch at which pads on the wiring substrate are arranged) is very small, which makes a gap between adjacent bump electrodes narrow. Therefore, it is necessary to achieve a stable connection between the bump electrodes and the pads, while ensuring that respective bump electrodes with a narrow gap therebetween are insulated from each other.

Patent Document 4 discloses a technology for addressing a case in which a gap between respective bump electrodes in a driver IC chip is made narrower. In this document, a bump electrode structure is disclosed in which only a portion of each resin bump formed on a semiconductor device (IC chip) is covered by a conductive film. This bump electrode is formed in a hemispherical shape, and has elasticity, and the bump makes contact with a connecting terminal on the wiring substrate by being elastically deformed. Because only a portion of the bump is covered by the conductive film, it is possible to achieve an excellent electrical connection while reducing a risk of short-circuiting between adjacent electrodes.

If an anisotropic conductive layer is used as an adhesive when the gap between bump electrodes is narrow, the diameter of the conductive particles included in the anisotropic conductive layer (approximately 3 μm, for example) becomes too large to be negligible, and therefore, there is a possibility that short-circuiting between adjacent electrodes occurs due to the conductive particles. Possible solutions to such a problem include using an anisotropic conductive layer that has smaller conductive particles, or using a resin layer such as an NCF (non-conductive film) or an NCP (non-conductive resin paste) that does not have conductive particles. However, when using such adhesives, it is not possible to achieve the connectivity improving effect that takes advantage of the elastic deformation of the conductive particles included in a conventional anisotropic conductive layer.

Patent Document 5 discloses a connecting terminal having a structure in which a conductive layer is disposed so as to cover a protrusion made of a resin material and disposed on a substrate, as a configuration for making possible a connection between terminals having a narrow gap therebetween. In this configuration, a driver IC chip is mounted by using an adhesive (such as an NCF) that does not include conductive particles. Because electrodes of the driver IC chip are connected to elastic connecting terminals that protrude from the substrate surface, it is possible to ensure a reliable connection even if the substrate is warped and the like. Also, by using an adhesive layer that does not include conductive particles, it is possible to prevent short-circuiting between terminals from occurring in the adhesive layer.

However, as the resolution of the display devices is made higher and the frame region thereof is made narrower, it is expected that the gap between electrodes will be made even smaller. In such a case, it will become difficult to achieve a stable connection with the conventional face-down mounting structure described above. Explained below is a view of the inventors of the present invention with regard to this problem.

Figure 11:
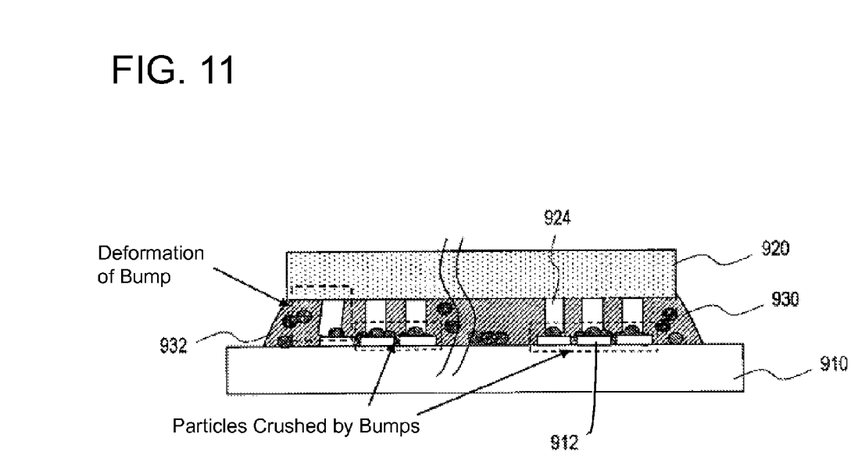
FIG. 11 is a cross-sectional view of a face-down chip mounting structure of a conventional COG method, when a gap between electrodes is narrow.

FIG. 11 shows a configuration in which the bare chip mounting is conducted using an ACF when gaps are small. As shown in FIG. 11, when the pitch at which bump electrodes 924 are arranged is made smaller, the width of each bump electrode 924 is also made smaller to ensure that adjacent electrodes are insulated from each other. When the bump electrodes 924 are made narrower than the conventional configuration as described above, the bump electrodes 924 become more susceptible to deformation. This causes a problem that the bump electrodes 924 are deformed when an IC chip 920 is pressure-bonded onto connecting terminals 912 of a substrate 910, thereby lowering connection reliability.

Also, when the bottom area of each bump electrodes 924 is made smaller, the pressure from the IC chip 920 acting on the substrate 910 is less likely to be dispersed, and therefore, a stronger force is applied by each individual bump electrode. This results in a phenomenon in which, during the pressure-bonding, conductive particles dispersed in the ACF 930 do not undergo proper elastic deformation, and are crushed by the bump electrodes. As described above, in the COG connection with a smaller pitch, the reliability of an electrical connection between the IC chip and the terminals on the wiring substrate is lowered, thereby adversely affecting the stable driving of the display device and the like.

Due to the frame region of the display device being narrower, the aspect ratio of the driver IC chip is made greater, and IC chips having a vertically long rectangular shape are increasingly used. When a vertically long rectangular IC chip is used, it is harder to affix the entire IC chip to the substrate with an even pressure when mounting the IC chip onto the substrate, due to warping occurring between the IC chip and the TFT substrate (caused by the thermal stress) and the like. In such a case, in order to obtain a sufficient connectivity in all of the bump electrodes of the IC chip, one may consider applying a stronger pressure. However, if a strong pressure is applied to the bump electrodes having a narrow gap therebetween, the connectivity is lowered due to deformation and the like. Also, there is a higher possibility that adjacent terminals short-circuit with each other. Thus, a mounting structure in which a stable connection can be achieved with a smaller pressure and deformation of the bump electrodes is less likely to occur even when a pressure is applied has been sought after.

The present invention was made in view of the above-mentioned problem, and an object thereof is to provide a wiring substrate that can achieve a stable connection even when the pitch of the bump electrodes in the semiconductor chip is made smaller, and a chip mounting region is made narrower. Another object of the present invention is to provide an electronic circuit substrate in which a semiconductor chip is connected to the wiring substrate. Yet another object of the present invention is to provide a display device equipped with such an electronic circuit substrate.

Means for Solving the Problems

An electronic circuit substrate according to an embodiment of the present invention includes: a wiring substrate that has a substrate, and wiring lines, circuit elements, and connecting terminals that are formed on the substrate, the connecting terminals being connected to the circuit elements via the wiring lines; and a semiconductor chip mounted on the wiring substrate through the connecting terminals, wherein the connecting terminals of the wiring substrate each include: a pair of protrusions having a depression therebetween; and a depression electrode disposed in the depression and covering at least a part of each protrusion of the pair of protrusions, wherein the semiconductor chip has bump electrodes that are to be connected to the depression electrodes of the connecting terminals, respectively, and wherein a contact region where a depression electrode is in contact with a corresponding bump electrode forms a line shape in a plan view.

In one embodiment, each protrusion of the pair of protrusions extends along a first direction, and a direction in which the contact region that forms a line shape extends is parallel to the first direction.

In one embodiment, the respective depression electrodes and the respective bump electrodes are directly connected to each other at least partially in the contact regions.

In one embodiment, each of the bump electrodes has edges that define a bottom surface of the bump electrode, and at least one of the edges of the bump electrode is in contact with a depression electrode in the contact region.

In one embodiment, the electronic circuit substrate further includes a resin material layer disposed around the depression electrodes and the bump electrodes, and the resin material layer is made of a non-conductive film or a non-conductive paste.

In one embodiment, the pair of protrusions has elasticity.

In one embodiment, each protrusion of the pair of protrusions has a convex curved surface, and the depression is defined by at least the convex curved surfaces.

In one embodiment, a plurality of the connecting terminals are aligned along a prescribed direction in a mounting region of each semiconductor chip, and a pitch at which the connecting terminals are arranged at an edge of the mounting region is smaller than a pitch at which the connecting terminals are arranged at a center of the mounting region.

In one embodiment, a plurality of the connecting terminals are aligned along a prescribed direction in a mounting region of each semiconductor chip, and, of the pair of protrusions of each of the connecting terminals disposed at an edge of the mounting region, one protrusion that is closer to the edge of the mounting region is larger than another protrusion that is closer to a center of the mounting region.

In one embodiment, the circuit elements each have a TFT and a pixel electrode that is electrically connected to the TFT, and the wiring lines include gate bus lines and source bus lines connecting the connecting terminals and the TFTs to each other.

A display device according to an embodiment of the present invention includes: any one of the above-mentioned electronic circuit substrates; and a display medium layer that is driven by the electronic circuit substrate.

In one embodiment, the display device further includes another substrate disposed opposite to the electronic circuit substrate; and a liquid crystal layer as the display medium layer that is sandwiched between the electronic circuit substrate and the other substrate.

A wiring substrate according to an embodiment of the present invention includes: a substrate; and wiring lines, circuit elements, and connecting terminals that are formed on the substrate, the connecting terminals being respectively connected to the circuit elements via the wiring lines, wherein each of the connecting terminals includes: a pair of protrusions having a depression therebetween; and a depression electrode disposed in the depression and covering at least a part of each protrusion of the pair of protrusions, and wherein the depression is defined by a pair of inclined surfaces formed by the pair of protrusions, and a bump electrode of a semiconductor chip is selectively connected to the depression electrode at the pair of inclined surfaces.

Effects of the Invention

According to the present invention, even when the semiconductor chip having terminals (electrodes) arranged with a small gap therebetween is mounted with the COG mounting method, it is possible to obtain a stable electrical connection, while preventing short-circuiting between the terminals.

BRIEF DESCRIPTION OF THE DRAWINGS

FIG. 7(a) shows a case in which an ACF/ACP is used, and FIG. 7(b) shows a case in which an NCF/NCP is used.

DETAILED DESCRIPTION OF EMBODIMENTS

A COG mounting method in which a driver IC chip is mounted on connecting terminals on a substrate is widely adopted. In many cases, an anisotropic conductive layer such as an ACF or an ACP is used as a method to connect the chip and the substrate to each other. However, as described above, when the pitch of terminals is made smaller, there is a problem that leakage (short-circuiting) between adjacent terminals is more likely to occur due to the size of the conductive particles included in the ACF. One possible countermeasure for the leakage is to reduce the diameter of the conductive particles, but if the size of the conductive particles is made smaller, it becomes difficult to ensure a sufficient elastic deformation of the particles, and as a result, the connection reliability is lowered.

Taking such a problem into account, studies have been conducted on a COG mounting method that can achieve an appropriate electrical connection even when an ACF having smaller conductive particles are used, or a COG mounting method in which a non-conductive adhesive such as an NCF or an NCP, for example, is used, instead of an ACF, and for example, Patent Document 5 discloses a mounting structure using an NCF. The inventors of the present invention also have disclosed a COG mounting method that allows for the use of a non-conductive adhesive (Japanese Patent Application No. 2009-264613). In the disclosure, a configuration is shown in which, in the chip mounting region, connecting terminals are formed by providing an insulating layer having a proper elasticity on the wiring substrate, and by thereafter forming electrodes. In such a configuration, the driver IC chip is COG-mounted on the wiring substrate by using a non-conductive adhesive or an adhesive that includes very small conductive particles that are 1 μm or less, and the bump electrodes and the connecting terminals are directly connected to each other.

If an anisotropic conductive layer is not used, it is important that the bump electrodes and connecting terminals make contact with each other directly and stably. That is because if a resin material is interposed therebetween, it is not possible to achieve a sufficiently reliable connection. Therefore, in order to make the bump electrodes and the connecting terminals contact with each other more reliably, it is necessary to press the IC chip against the connecting terminals more strongly, thereby pushing a resin out of the contact region.

However, it is not preferable to apply a strong pressure to the bump electrodes having a small pitch and thus being susceptible to deformation, because it can deteriorate the connection reliability, or it can cause a leakage. In order to achieve a structure for addressing a smaller pitch and enabling the COG mounting with a smaller pressure, the inventors of the present invention have conducted various studies on a configuration that can use an ACF including conductive particles smaller than those in a conventional configuration, an NCF (non-conductive film), an NCP (non-conductive paste), or the like and that can obtain a stable electrical connection while preventing short-circuiting between terminals. As a result, it was discovered that the COG mounting can be implemented properly even when the pitch is small, by configuring a chip mounting structure such that the wiring substrate is electrically connected selectively to edges of each bump electrode of the driver IC chip, typically, at a depression formed between a pair of protrusions formed on the wiring substrate.

Below, embodiments of the present invention will be explained with reference to figures, but the present invention is not limited to these embodiments.

FIGS. 1(a) and 1(b) schematically show a liquid crystal module 100 used in a liquid crystal display device of an embodiment of the present invention. The liquid crystal module 100 includes a display panel 10, a driver IC chip (semiconductor chip) 24 that is mounted on the display panel 10 with the COG mounting method, and an FPC (flexible external printed circuit) 26 connected to the display panel 10.

The liquid crystal display device can be manufactured by appropriately combining the liquid crystal module 100 with a known backlight unit (not shown) and the like. That is, the liquid crystal display device of the present embodiment has the same configuration as that of a conventional liquid crystal display device, except that the liquid crystal module 100 is used. FIG. 1(a) shows a configuration in which only one IC chip 24 is mounted on one side of the display panel 10, but it is apparent that a plurality of IC chips 24 can be respectively mounted on a plurality of sides of the display panel 10.

The display panel 10 has a pair of substrates 11 and 12, and a liquid crystal layer 13 disposed between the substrate 11 and the substrate 12. The liquid crystal layer 13 is sealed in by a sealing member 14 between the substrate 11 and the substrate 12. On the surface of the substrate 11 facing the liquid crystal layer 13, electrodes (and wiring lines), an alignment film, and the like are disposed as necessary, and on the surface of the substrate 12 facing the liquid crystal layer 13, color filters, electrodes (and wiring lines), and an alignment film are disposed as necessary.

In an active matrix liquid crystal display device, switching elements (typically, TFTs) are additionally disposed on the surface of the substrate 11 facing the liquid crystal layer 13. Those components are not shown in the figures for ease of explanation. The substrate 11 and the substrate 12 are typically made of glass substrates. Here, the substrate 11 and the substrate 12 each refer to a combined structure of a glass substrate and the above-mentioned configuration provided on the surface of the substrate on the side facing the liquid crystal layer 13. A substrate on which the driver IC chip 24 is mounted is referred to as a wiring substrate 11 (typically, TFT substrate), and the other substrate is referred to as an opposite substrate 12. In the present specification, TFTs, pixel electrodes, and the like formed on the wiring substrate 11 may be referred to as circuit elements.

FIG. 1(b) shows a cross section along the line A-A' in the liquid crystal module shown in FIG. 1(a). In a terminal region 11a on the wiring substrate 11, wiring lines extending from the display panel 10 and connecting terminals 51 (see FIG. 2), which will be later described, are formed. The driver IC chip 24 is mounted on the terminal region 11a of the wiring substrate 11 by using an anisotropic conductive film (ACF) 31. The FPC 26 is connected to the terminal region 11a of the wiring substrate 11 by using an AFC 32, for example. Output terminals of the FPC 26 are connected to wiring lines on the wiring substrate 11 for supplying various signal voltages, power voltages, and the like to the IC chip 24. Bump electrodes of the IC chip 24 are connected to the connecting terminals of the wiring substrate 11, and operations of the display panel 10 are controlled by the IC chip 24 via wiring lines.

The liquid crystal module 100 has polarizing plates 17 and 18 on both sides of the display panel 10 in a display region. Furthermore, in the terminal region 11a, a protective layer 27 made of a resin or the like is disposed to cover the driver IC chip 24.

Figure 2:
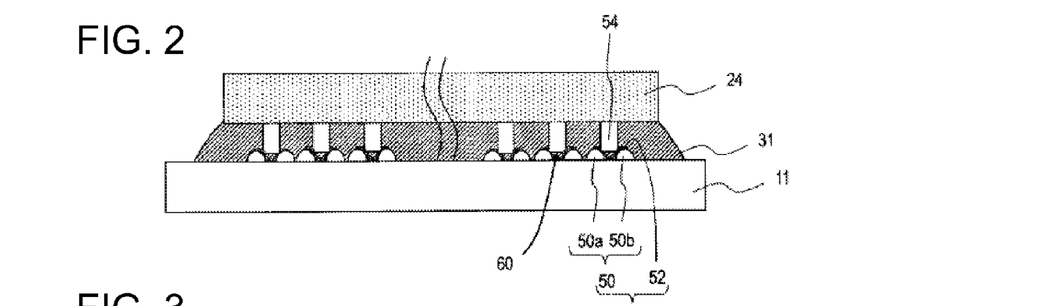
FIG. 2 is a cross-sectional view showing a chip mounting structure according to an embodiment of the present invention.

FIG. 2 illustrates a structure for mounting the driver IC chip 24 onto the wiring substrate 11 in the terminal region 11a mentioned above, showing a cross section of the mounting structure along a direction that is parallel to one side of the IC chip 24. In the liquid crystal module 100, a COG method is adopted in which the driver IC chip 24 (driver element, semiconductor chip) is mounted on the wiring substrate 11 of the display panel 10 with the bare chip mounting. As shown in the figure, the driver IC chip 24 is connected and affixed to the wiring substrate 11 through the ACF 31.

In the driver IC chip 24, bump electrodes 54 are formed with a small gap therebetween. These bump electrodes 54 are connected to the connecting terminals 51 on the wiring substrate 11 by the face-down bonding. The bump electrodes 54 are formed of a metal with high conductivity such as Au, for example, and can take various shapes, but typically, each bump electrode is formed in a substantially rectangular cuboid shape, and the bottom surface thereof has a rectangular shape.

Each of the connecting terminals 51 formed in the terminal region 11a of the wiring substrate 11 has a pair of protrusions 50 that protrude from the main surface of the wiring substrate 11. Between the respective protrusions 50a and 50b, a depression 60 is formed, and an electrode (depression electrode) 52 is disposed to cover the depression 60. Each protrusion 50a or 50b in the pair of protrusions 50 has a semicircular column shape, for example (see FIG. 3(a) and the like). The depression 60 is a space that is at least partially surrounded by curved surfaces defined as the side surfaces of the column shape. However, the depression 60 is not limited thereto, and may be defined by curved surfaces of other shapes (preferably a concave curved surface).

In the present embodiment, the protrusions 50a and 50b are formed of an elastic body, and is made of a polyimide, an acrylic resin, a photosensitive resin, or the like, for example. When the panel manufacturing process includes a step of forming a layer of the above-mentioned material at a prescribed thickness throughout the entire display region immediately below the pixel electrodes, the protrusions 50a and 50b made of the above-mentioned material can be formed in such a step, for example. The resin material layer disposed immediately below the pixel electrodes is used for reducing parasitic capacitance formed between the pixel electrodes and source or gate bus lines and the like. On the other hand, the depression electrodes 52 can be formed simultaneously with the pixel electrodes in a step of forming the pixel electrodes. As described above, the connecting terminals 51 each made of the protrusions 50 and the depression electrode 52 can be made without adding new steps to the conventional liquid crystal panel manufacturing process. However, it is apparent that the connecting terminals 51 can also be formed in a separate step.

As described above, the depression electrodes 52 can be formed at the same time as the pixel electrodes, but if the pixel electrodes are made of a transparent conductive film such as ITO, it is also possible to form the depression electrodes 52 of a metal film that has high elasticity (aluminum film, for example). By doing so, it is possible to prevent the depression electrodes 52 from hindering the elastic deformation of the protrusions 50. If the depression electrode 52 is formed of a material that has high elasticity or toughness, it is possible to achieve an advantage that the depression electrode 52 is not likely to crack when the protrusions 50 are elastically deformed when the chip is mounted. When the pixel electrodes are made of aluminum or the like in a reflective display device or a transflective display device, it is preferable that the depression electrodes 52 be made in the step of forming the pixel electrodes by using the same material as the pixel electrodes.

Figure 3:
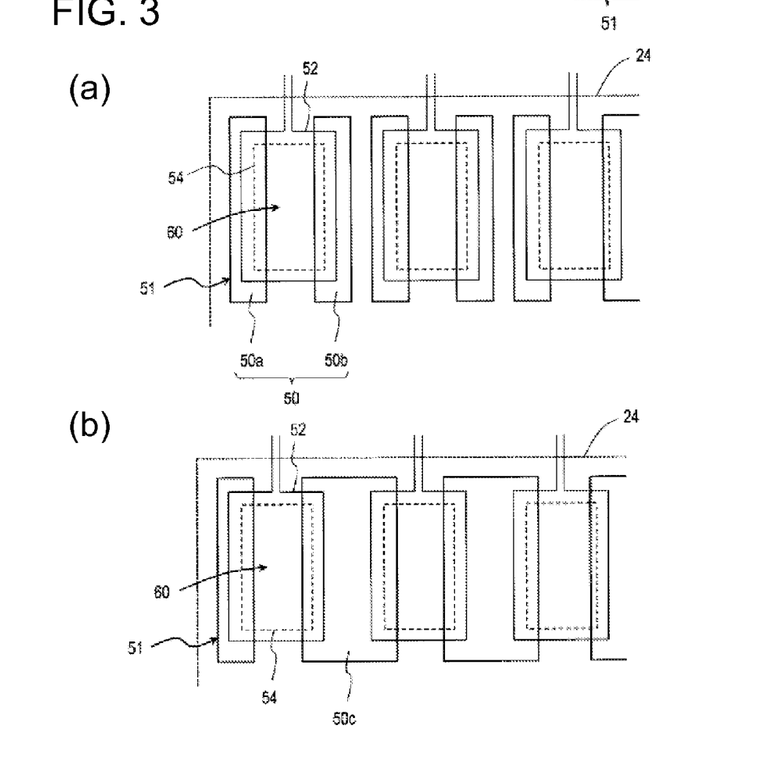
FIG. 3(a) is a top view of a chip mounting structure of an embodiment of the present invention.
FIG. 3(b) is a top view of a chip mounting structure of a modification example of FIG. 3(a).

FIG. 3(a) is a top view showing an arrangement of the connecting terminals 51 and the bump electrodes 54. As shown in the figure, the protrusions 50a and 50b that form the depression 60 typically extend along the short side direction of the IC chip 24 mounted thereon. As shown in FIG. 2 and the like, the connecting terminals 51 and the bump electrodes 54 are connected to each other at edges of the bottom surfaces of the bump electrodes 54. In this connection configuration, each contact region where the connecting terminal 51 is in contact with the bump electrode 54 extends along the extension direction of the protrusions 50 so as to be substantially parallel thereto. However, the arrangement of the protrusions 50a and 50b or the arrangement of the depression electrodes 52 covering the depressions 60 is not limited to the configuration shown in the figure.

As shown in FIG. 3(b), for example, it is also possible to use a common protrusion 50c for two adjacent bump electrodes 54. The pair of protrusions 50 provided for one bump electrode 54 does not necessarily have to be separated, and may be formed integrally with each other as long as a depression 60 is formed therebetween.

Figure 4:
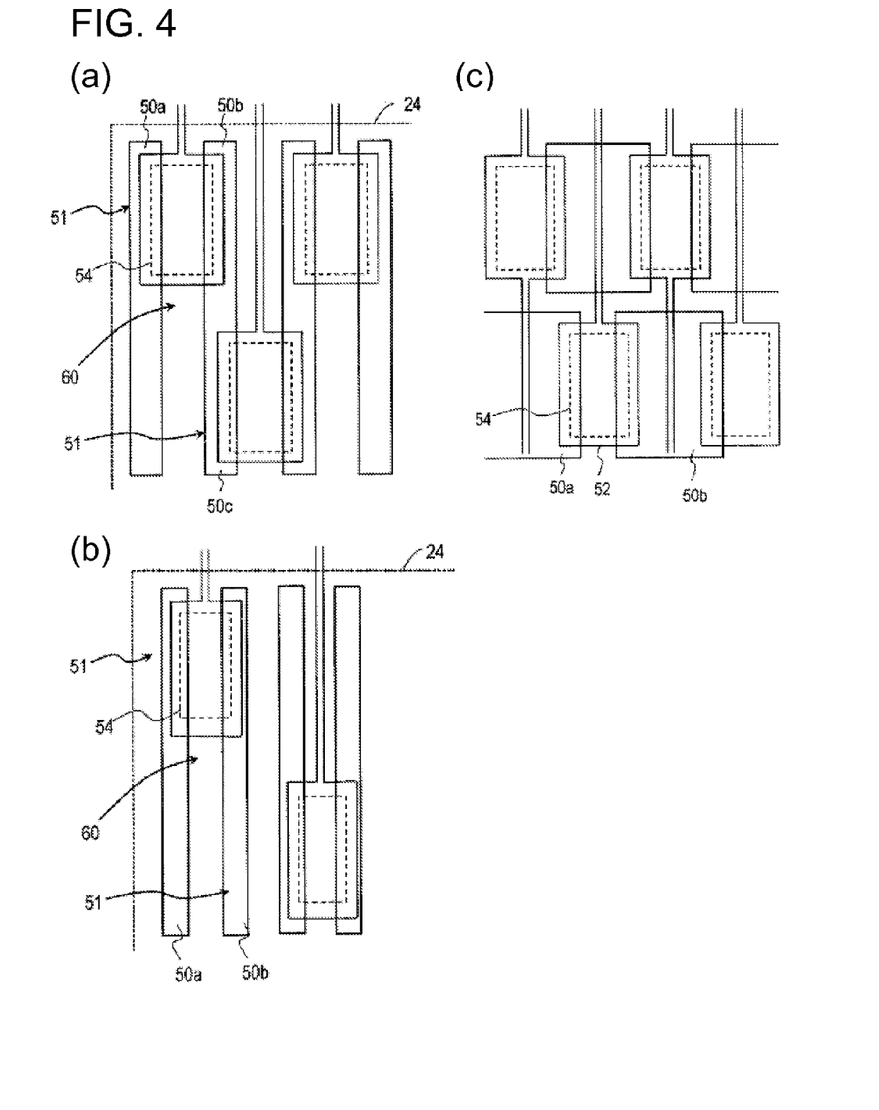
FIG. 4(a) is a top view of a chip mounting structure for a staggered arrangement of terminals.
FIG. 4(b) is a top view of a chip mounting structure of a modification example of FIG. 4(a)
FIG. 4(c) is a top view of another modification example.

As shown in FIG. 4(a), corresponding to the IC chip 24 where the bump electrodes 54 are arranged in a staggered pattern, the connecting terminals 51 may also be arranged in a staggered pattern. In such an arrangement, signal lines and scan lines disposed in the display panel 10 can be drawn to the connecting terminals 51 with greater ease. In the connecting terminals 51 having a narrow gap therebetween, in particular, if the connecting terminals 51 are arranged in a staggered pattern, it is not necessary to draw wiring lines so as to go around adjacent connecting terminals 51 even when a plurality of rows of terminals are arranged, and therefore, it becomes easier to draw wiring lines for the connecting terminals 51. In this way, it is possible to dispose thicker wiring lines in a straight line shape. FIG. 4(a) shows a configuration in which, when the connecting terminals 51 are arranged in a staggered pattern, a protrusion 50c that is used commonly for two bump electrodes 54 adjacent to each other diagonally is provided as one of the pair of protrusions 50a and 50b. However, as shown in FIG. 4(b), it is also possible to individually provide a pair of protrusions 50a and 50b for each of the bump electrodes 54 adjacent to each other. Furthermore, as shown in FIG. 4(c), it is also possible to provide protrusions 50a and 50b commonly used for respective two bump electrodes 54 adjacent to each other in the horizontal direction.

Figure 5:
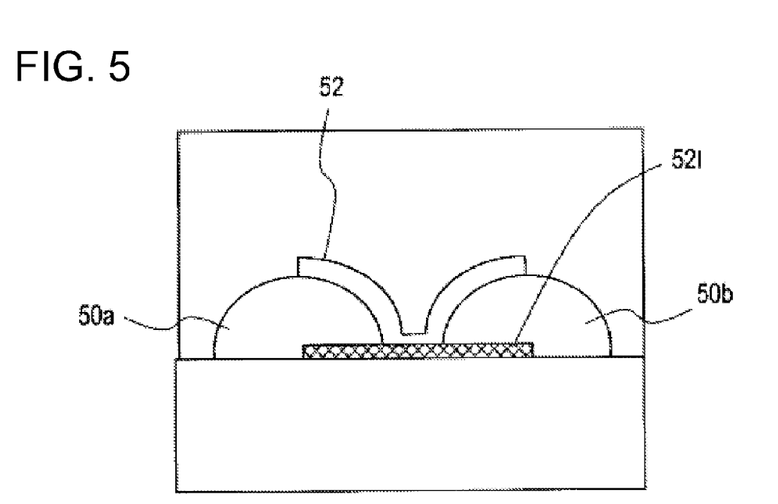
FIG. 5 is a cross-sectional view of a connecting terminal according to another embodiment of the present invention.

As shown in FIG. 5, wiring 521 that extends from a liquid crystal panel and the depression electrode 52 formed on the pair of protrusions 50a and 50b (protrusions 50) are typically formed in different steps. In this case, the wiring 521 can be formed in the same layer as the source or gate bus lines, and after forming the protrusions 50 thereon, the depression electrode 52 can be provided so as to be electrically connected to the wiring 521. In such a configuration, because the wiring 521 is disposed below the protrusions 50, it is possible to form the wiring 521 in a desired pattern regardless of the shape of the protrusions 50. The configuration shown in FIG. 4(c), for example, can be obtained by forming the protrusions 50 on the wiring that has been formed in a desired pattern, and by thereafter forming the depression electrode 52 in a desired pattern to partially cover the protrusions 50 and to be electrically connected to the wiring in a proper manner.

Although FIG. 5 shows a configuration in which an electrical connection between the wiring 521 and the depression electrode 52 is established in an area between the pair of protrusions 50a and 50b, the present invention is not limited thereto, and any connection configuration can be used. For example, it is possible to employ a configuration in which a resin layer including the protrusions 50 is formed over the wiring, and an electrical connection between the wiring 521 and the depression electrode 52 is established through a contact hole disposed in an appropriate position in this resin layer.

Figure 6:
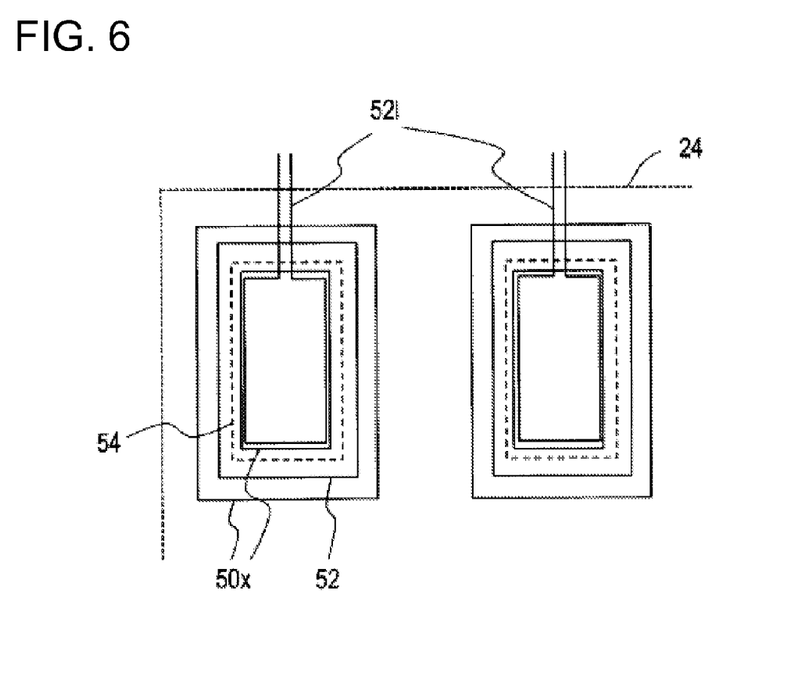
FIG. 6 is a top view showing a chip mounting structure of yet another embodiment of the present invention.

As shown in FIG. 6, a protrusion 50x having a rectangular frame shape can also be used. The protrusion 50x is made of four line-shaped portions that respectively face four side edges of the bottom surface of the bump electrode. In the present specification, when such a protrusion having a rectangular frame shape is formed, two opposite sides out of the portions forming this protrusion may be referred to as a pair of protrusions.

Figure 1:
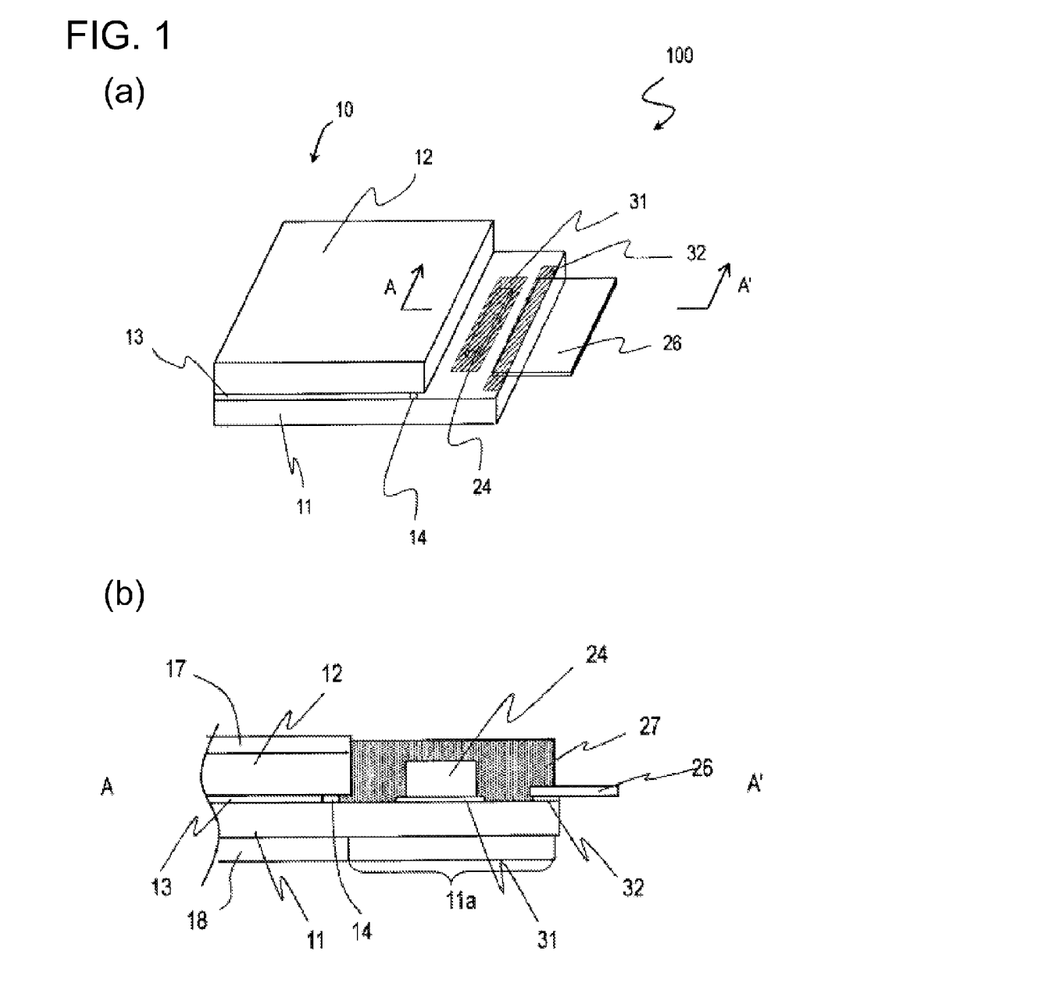
FIG. 1(a) is a perspective view of a liquid crystal module of an embodiment of the present invention.
FIG. 1(b) is a cross-sectional view along the line A-A' in FIG. 1(a).

Referring to FIGS. 1 and 2 again, a process to mount the IC chip 24 onto the terminal region 11a of the liquid crystal module 100 using the ACF 31 will be explained below.

First, the ACF 31 is applied on the wiring substrate 11 having the connecting terminals 51 formed in the terminal region 11a thereof, and thereafter, the wiring substrate 11 and the driver IC chip 24 are brought to proper positions with respect to each other. Next, thermal pressure bonding is conducted from the side of the driver IC chip 24 by using a pressure bonding tool or the like. The bonding conditions are as follows, for example: the temperature is 160° C. to 210° C.; the pressure is 40 MPa to 100 MPa; and a pressurized time is 5 seconds to 20 seconds.

Through this thermal pressure bonding, conductive particles sandwiched between the connecting terminals 51 and the bump electrodes 54 are elastically deformed (flattened), and by the insulating adhesive therearound being cured, the conductive particles are held in place while maintaining the deformed state. As a result, electricity flows between the connecting terminals 51 and the bump electrodes 54, and the electrical connection therebetween is established. As described above, through the thermal pressure bonding using the ACF 31, the driver IC chip 24 is affixed onto the wiring substrate 11 while establishing an electrical connection between the IC chip 24 and the wiring substrate 11.

The ACF 31 used in the present embodiment can be obtained by mixing conductive particles in an insulating adhesive. The particle diameter of the conductive particles is 2 to 3 μm, for example, and the packing density of the conductive particles is set to 55000 to 60000 particles/mm², for example. The conductive particles can be formed by coating plastic particles with nickel, and thereafter coating the particles with gold. The insulating adhesive includes an epoxy resin with a weight-average molecular weight of 10000 to 100000, an epoxy resin with a weight-average molecular weight of 1000 or less, and a curing agent, for example. The ACF 31 made of such a material has a Young's modulus of 1.4 GPa to 2.0 GPa after curing, and a glass-transition temperature of 110° C. to 135° C. after curing, for example.

With the configuration of the present embodiment, a region where the bump electrode 54 and the connecting terminal 51 (depression electrode 52) are connected to each other is formed in a line shape, and it is possible to bond these components with a smaller pressure while obtaining a suitable electrical connection therebetween. Therefore, it is not necessary to use the above-mentioned ACF 31. That is, it is also possible to use a resin layer (adhesive layer) that includes smaller and less elastic conductive particles, or it is possible to use a resin layer that does not include conductive particles as described below.

Next, with reference to FIGS. 7(a) and 7(b), the connection configuration between the bump electrodes 54 of the IC chip 24 and the connecting terminals 51 of the wiring substrate 11, which were shown in FIG. 2, will be explained.

Figure 7:
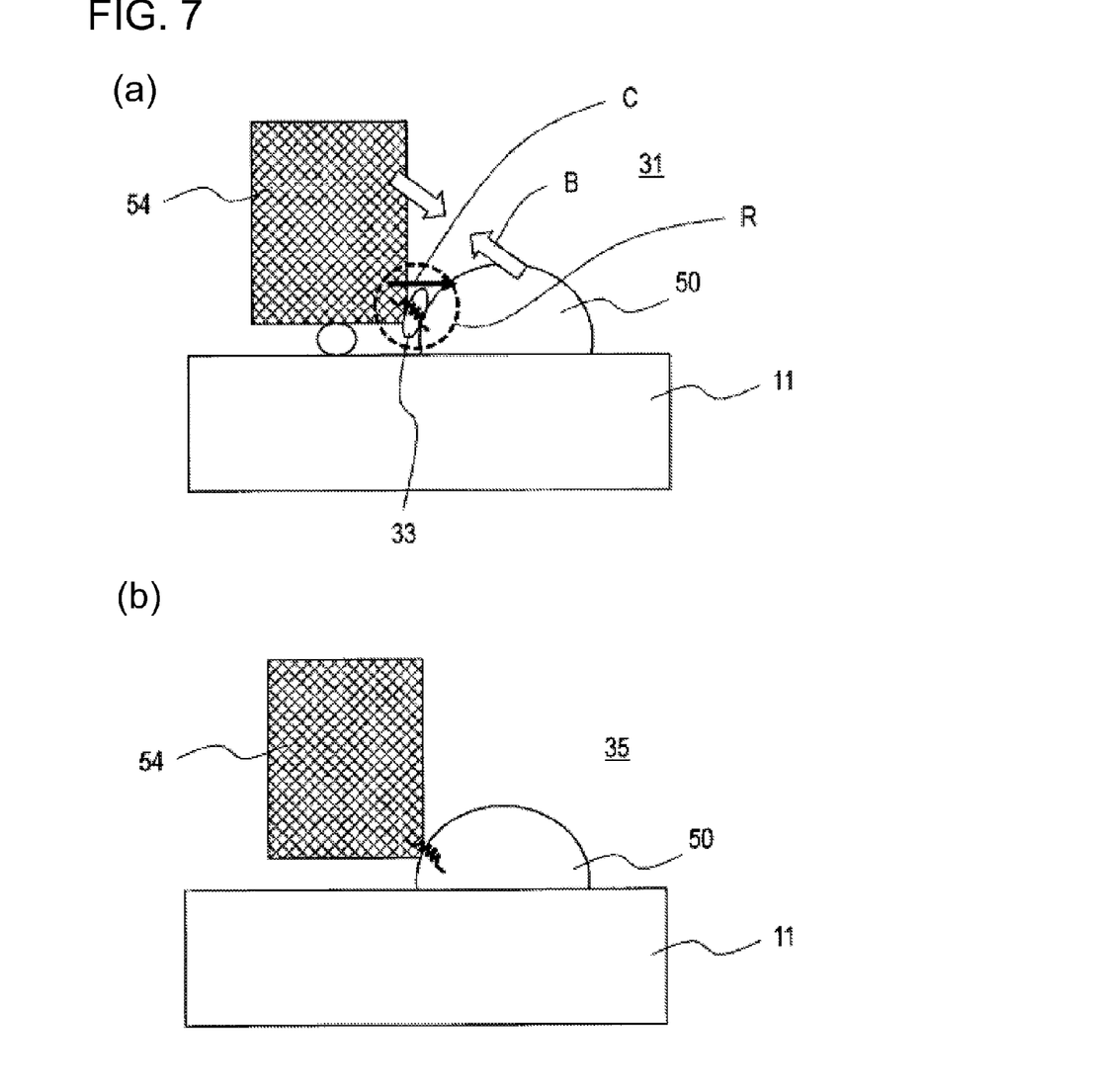
FIG. 7 shows a connecting structure between a bump electrode and a connecting terminal in a chip mounting structure.

As shown in FIG. 7(a), when establishing the electrical connection between the bump electrodes 54 and the connecting terminals 51 through an anisotropic conductive layer made of the ACF 31, side faces and edges of the bump electrodes 54 are connected to the side faces of the depression electrode 52 (not shown in FIG. 7(a)) on the protrusions 50. The same is true for the case where an ACP is used instead of the ACF 31. When the ACF/ACP is used as described above, the bump electrode 54 and the depression electrode 52 are connected to each other by utilizing the elastic deformation in the diagonal direction of the conductive particles 33 that are sandwiched between the bump electrode 54 and the depression electrode 52.

In the process of bonding the IC chip 24 using the ACF 31, the conductive particles 33 interposed between the bump electrode 54 and the depression electrode 52 receive a concentrated force. This is because the bump electrode 54 and the depression electrode 52 are connected to each other selectively at the edges or side faces of the bump electrode 54 (or in other words, the bump electrode 54 typically makes contact with the depression electrode 52 only at edges or side faces thereof). At this time, the region where the depression electrode 52 and the bump electrode 54 are connected to each other is formed in a line shape along the direction in which the protrusions 50 extend. In such a case, it is possible to obtain an electrical connection by elastically deforming the conductive particles 33 of the ACF 31 with a smaller pressure than that in a conventional configuration in which the bump electrode is connected to a corresponding electrode at the entire bottom surface thereof.

Also, as shown in FIG. 7(a), the contraction force C generated by the resin material in the ACF 31 after cooling can be used as a vector of a force acting in the direction in which the bump electrode 54 and the connecting terminal 51 (see FIG. 2) are connected to each other.

In the present embodiment, because the edges of the bump electrode 54 makes contact with the side faces of the protrusions 50, the thickness of the resin layer of the ACF 31 is made greater than that in the case in which the bottom surface of the bump electrode makes contact with a connecting terminal having a flat surface. As described above, by increasing the thickness of the resin layer of the ACF 31 as compared to the conventional configuration, it is possible to obtain a cohesion force B that is greater than the conventional configuration when curing the resin material that functions as an adhesive. As a result, an electrical connection can be established with a smaller pressure. The cohesion force in this specification refers to a pulling force acting between molecules in the adhesive material or in the bonding material.

Furthermore, in the present embodiment, the contact region forms a line shape, and therefore, during the pressure bonding, the resin material can be pushed out with greater ease than the case in which two surfaces are brought into contact with each other. This makes it possible to prevent a situation in which the cured resin material blocks a pressure from being applied to the conductive particles 33, and as a result, the conductive particles 33 can receive a sufficient pressure to be deformed.

In the present embodiment, it is important that the bump electrode 54 is connected to the connecting terminal 51 at the side faces (inclined surfaces) of the protrusions 50. Therefore, it is preferable that the depression electrode 52 be disposed on at least side faces of the protrusions 50 (or depression 60). Also, unlike the conventional configuration, the deformation of the conductive particles 33 positioned below the bump electrode 54 may be insufficient. The connection at the bottom surface of the bump electrode 54 can be considered as an auxiliary connection.

In the configuration described above, the bump electrode 54 having a narrower width is supported by the depression 60 formed by the pair of the protrusions 50 that support the bump electrode 54 from the left and right sides, and an electrical connection is established at side faces of the protrusions 50 (or depression 60) and the like. The contact region where the electrical connection is established (edges of the bump electrode 54) preferably forms a line shape along the direction in which the protrusions 50 extend. In this configuration, it is not necessary to strongly press the bump electrodes 54 against the wiring substrate 11 during the pressure bonding, and therefore, a pressure applied on the bump electrodes 54 and the substrate 11 can be reduced. As a result, it is possible to improve the connection reliability while preventing the deformation of the bump electrodes 54 and the like.

As described above, with the configuration in which the bump electrodes is connected to the wiring substrate at the respective depressions each formed by a pair of protrusions provided on the wiring substrate, even when the pitch of the bump electrodes is made narrower, it is possible to ensure the connection reliability. This configuration is particularly effective when the arrangement pitch of the bump electrodes or the connecting terminals is 20 μm or less, and is even more effective when the pitch is 13 μm or less.

In the configuration in which the side faces or the edges of the bump electrode 54 are connected to the side faces of the depression 60 of the connecting terminal 51, it is possible to use an NCF or an NCP as a connecting material, in addition to an ACF and an ACP. However, when using a non-conductive adhesive such as an NCF or an NCP, it is preferable that the protrusions 50 be made of a material that has a prescribed elasticity.

FIG. 7(b) shows a connecting configuration in the case of using a non-conductive adhesive such as an NCF or an NCP. When the NCF (or NCP) 35 is interposed between the IC chip 24 and the wiring substrate 11, edges or side faces of the bump electrode 54 directly make contact with the depression electrode 52 (not shown in FIG. 7(b)) on the protrusions 50, while causing the protrusions 50 having elasticity to be elastically deformed. As a result, the bump electrode 54 and the depression electrode 52 are electrically connected to each other.

Therefore, it is not necessary to use, as an adhesive layer, an anisotropic conductive layer that includes conductive particles having a relatively large diameter, unlike the conventional configuration, and an adhesive layer that does not include conductive particles or an adhesive layer that includes smaller conductive particles can be used. As a result, even when the terminals are arranged at a smaller pitch, the occurrence of leakage between terminals can be prevented.

When using an adhesive layer that has smaller and harder conductive particles, the following advantages can be obtained, in addition to preventing the occurrence of leakage between terminals. When the depression electrodes 52 are formed on the wiring substrate as described above, depending on the material for the depression electrodes 52, a very thin high resistance film such as an oxide film or a hydroxide film can be formed on the surface thereof. In this case, if the chip is mounted by using the adhesive layer that includes conductive particles made of nickel particles of 1 µm, for example, the conductive particles can break the high resistance film, and therefore, it is possible to improve the electrical conductivity between the bump electrodes 54 and the depression electrodes 52.

If the protrusions 50 are made of the material with high elasticity, even when the adhesive expands due to moisture absorption or thermal effect after mounting the chip, the protrusions 50 that have been elastically deformed can return to the original shape toward the bump electrode 54, and therefore, the stable electrical connection can be maintained. Also, even when there is a difference in height between the respective bump electrodes 54, the difference can be absorbed by the elastic deformation of the protrusions 50, and the suitable electrical connection can be obtained at the respective terminals.

If using an ACF or an ACP, even when the connecting terminals 51 do not have elasticity, it is still possible to maintain the reliable connection as a result of the elastic properties of the conductive particles dispersed in the ACF or the ACP. Therefore, the protrusions 50 can be formed of a material that has low elasticity.

Below, with reference to FIGS. 8 and 9, modification examples of the above-mentioned chip mounting structure will be explained. In the modification example shown in FIG. 8, a pitch P1 at which a plurality of connecting terminals 51 for one IC chip 24 mounted thereon are arranged is made smaller in the edge portions of the region where the connecting terminals 51 are provided than that in the center portion thereof. Generally, the pitch P0 of the bump electrodes 54 of the IC chip 24 is constant. If the pitch P1 at which the connecting terminals 51 are arranged is made smaller only in the edge portions, a force that moves the IC chip 24 toward the center portion along the horizontal direction is generated during the pressure bonding. Because this force is generated at both sides of the IC chip 24 and even out, it makes it easier to properly position the IC chip 24 and the connecting terminals 51 with respect to each other.

Figure 9:
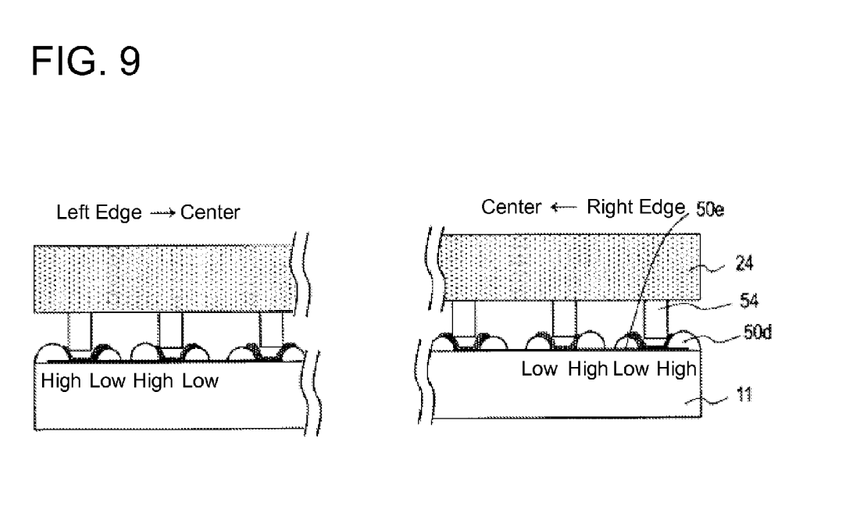
FIG. 9 shows a modification example of an embodiment of the present invention, illustrating a configuration in which a height of protrusions of each connecting terminal is changed at both ends of an IC chip.

As shown in FIG. 9, proper positioning of the IC chip 24 and the connecting terminals 51 to each other can also be realized by changing the size (height) of the protrusions 50 within the region where the chip is mounted. If the protrusion 50d closer to the outer side (edge portion) is made higher, and the protrusion 50e closer to the center is made lower, a force that acts from the respective edges of the IC chip 24 to the center thereof is generated when the IC chip 24 is pressed against the wiring substrate 11.

Figure 8:
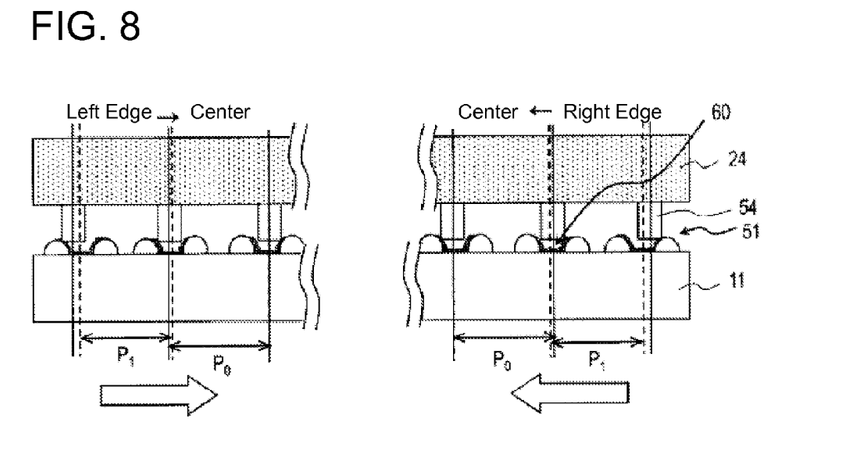
FIG. 8 shows a modification example of an embodiment of the present invention, illustrating a configuration in which an arrangement pitch of connecting terminals is changed at both ends of an IC chip.

In these configurations shown in FIGS. 8 and 9, the bump electrodes 54 engage the depressions 60 when the chip is mounted, and therefore, the IC chip 24 can be self-aligned to the wiring substrate 11. This makes it possible to position the wiring substrate 11 and the IC chip 24 to each other with greater ease.

As described above, the wiring substrate is configured such that connecting terminals that each have a depression and that preferably have a prescribed elasticity in the surface portion are provided in the terminal region of the liquid crystal module, thereby making it possible for the edges of the respective bump electrodes and the side faces of the respective depressions formed by the elastic bodies to be brought into contact with each other. With this configuration, the bump electrodes and the connecting terminals can be electrically connected to each other by using the curing contraction force of the adhesive (resin layer) in the longitudinal direction of the IC chip, or the stress concentration at the bump edges. This makes it possible to connect these components to each other with a smaller pressure (almost no pressure), and therefore, the occurrences of the deformation of the bump electrode and the conductive particles in the anisotropic conductive layer being crushed can be reduced.

The protruding elastic bodies forming the connecting terminals can be made of polyimide, an acrylic resin, a photosensitive resin, or the like. As the adhesive interposed between the bump electrodes and the connecting terminals, a resin material that includes Ni particles or metal nanoparticles (having a diameter of approximately 1 µm or less, for example) can be used, in addition to ACF, ACP, NCF, and NCP.

When using the ACF or the ACP, the protrusions forming the connecting terminals on the wiring substrate do not need to have elasticity. As described above, the group of terminals may be arranged in a staggered pattern, in addition to the one-line arrangement. The connecting terminals can be manufactured by using a general manufacturing process of a reflective or transflective liquid crystal display device. However, a process to form an elastic resin layer for forming the protrusions may be added as necessary.

In the embodiments above, the mounting structure of the driver IC chip in the liquid crystal display device was described, but the present invention is not limited to these embodiments. The present invention can be applied widely to a structure in which a semiconductor chip (IC chip or LED chip, for example) is mounted on a circuit substrate with the face-down mounting, and even when the pitch between terminals is made narrower, it is possible to improve the connection reliability while mitigating short-circuiting between terminals. An electronic circuit substrate obtained by mounting a semiconductor chip on the wiring substrate of the present invention can be suitably used in various electronic devices such as liquid crystal display devices, organic EL display devices, and image sensors, for example.

The arrangement of the connecting terminals formed on the wiring substrate may be appropriately changed so as to correspond to the arrangement of terminals (electrodes) of a chip to be mounted. The present invention can also be applied to a chip having a structure in which electrodes are arrayed on a square chip, for example, in addition to a rectangular driver IC chip.

INDUSTRIAL APPLICABILITY

The embodiments of the present invention can be suitably used for mounting a driver IC chip with the COG mounting in a liquid crystal module used in a display device. The embodiments of the present invention can also be applied to an organic EL module and the like, in addition to the liquid crystal module. The display device according to the embodiments of the present invention may be a plasma display panel, a field emission display, and the like.

DESCRIPTION OF REFERENCE CHARACTERS

100 liquid crystal module
11 wiring substrate
12 opposite substrate
13 liquid crystal layer
14 sealing member
24 driver IC chip
31 anisotropic conductive film (ACF)
33 conductive particle
50 pair of protrusions
51 connecting terminal
52 depression electrode
54 bump electrode
60 depression

The invention claimed is:

1. An electronic circuit substrate, comprising:
a wiring substrate that has a substrate, and wiring lines, circuit elements, and connecting terminals that are formed on said substrate, the connecting terminals being connected to the circuit elements via the wiring lines; and
a semiconductor chip mounted on the wiring substrate through the connecting terminals,
wherein the connecting terminals of the wiring substrate each comprise:
a pair of protrusions having a depression therebetween; and
a depression electrode disposed in the depression and covering at least a part of each protrusion of the pair of protrusions,
wherein the semiconductor chip has bump electrodes that are to be connected to the depression electrodes of the connecting terminals, respectively, and
wherein a contact region where a depression electrode is in contact with a corresponding bump electrode forms a line shape in a plan view.

2. The electronic circuit substrate according to claim 1, wherein each protrusion of the pair of protrusions extends along a first direction, and a direction in which the contact region that forms a line shape extends is parallel to the first direction.

3. The electronic circuit substrate according to claim 1, wherein the depression electrode and the bump electrode are directly connected to each other at least partially in the contact region.

4. The electronic circuit substrate according to claim 1, wherein each of the bump electrodes has edges that define a bottom surface of the bump electrode, and at least one of said edges of the bump electrode is in contact with the depression electrode in the contact region.

5. The electronic circuit substrate according to claim 1, further comprising a resin material layer disposed around the depression electrodes and the bump electrodes,
wherein the resin material layer is made of a non-conductive film or a non-conductive paste an NCP.

6. The electronic circuit substrate according to claim 1, wherein the pair of protrusions has elasticity.

7. The electronic circuit substrate according to claim 1, wherein each protrusion of the pair of protrusions has a convex curved surface, and
wherein the depression is defined by at least the convex curved surfaces.

8. The electronic circuit substrate according to claim 1, wherein a plurality of said connecting terminals are aligned along a prescribed direction in a mounting region of each said semiconductor chip, and
wherein a pitch at which the connecting terminals are arranged at an edge of the mounting region is smaller than a pitch at which the connecting terminals are arranged at a center of the mounting region.

9. The electronic circuit substrate according to claim 1, wherein a plurality of said connecting terminals are aligned along a prescribed direction in a mounting region of each said semiconductor chip, and
wherein, of the pair of protrusions of each of the connecting terminals disposed at an edge of the mounting region, one protrusion that is closer to the edge of the mounting region is larger than another protrusion that is closer to a center of the mounting region.

10. The electronic circuit substrate according to claim 1, wherein the circuit elements each have a TFT and a pixel electrode that is electrically connected to the TFT, and
wherein the wiring lines include gate bus lines and source bus lines connecting the connecting terminals and the TFTs to each other.

11. A display device, comprising:
the electronic circuit substrate according to claim 1; and
a display medium layer that is driven by the electronic circuit substrate.

12. The display device according to claim 11, further comprising:
an opposite substrate disposed opposite to the electronic circuit substrate; and
a liquid crystal layer as the display medium layer that is sandwiched between the electronic circuit substrate and the opposite substrate.

13. A wiring substrate, comprising:
a substrate; and
wiring lines, circuit elements, and connecting terminals that are formed on said substrate, the connecting terminals being respectively connected to the circuit elements via the wiring lines,
wherein each of the connecting terminals comprises:
a pair of protrusions having a depression therebetween; and
a depression electrode disposed in the depression and covering at least a part of each protrusion of the pair of protrusions, and
wherein the depression is defined by a pair of inclined surfaces formed by the pair of protrusions, and a bump electrode of a semiconductor chip is selectively connected to the depression electrode at the pair of inclined surfaces.

* * * * *